United States Patent
McCormick et al.

(10) Patent No.: US 6,927,346 B2
(45) Date of Patent: Aug. 9, 2005

(54) SURFACE MOUNT TECHNOLOGY TO VIA-IN-PAD INTERCONNECTIONS

(75) Inventors: Carolyn R. McCormick, Chandler, AZ (US); Terrance J. Dishongh, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/326,901

(22) Filed: Dec. 20, 2002

(65) Prior Publication Data

US 2004/0118606 A1 Jun. 24, 2004

(51) Int. Cl.[7] .................................................. H05K 1/16
(52) U.S. Cl. .................... 174/260; 174/262; 29/840; 29/843; 228/180.1; 228/180.21
(58) Field of Search .................... 174/260, 262–266, 174/261; 29/840, 837–839, 843; 228/180.1, 180.21; 361/772–776

(56) References Cited

U.S. PATENT DOCUMENTS

| | | | | |
|---|---|---|---|---|
| 5,493,075 A | * | 2/1996 | Chong et al. | 174/261 |
| 6,002,172 A | * | 12/1999 | Desai et al. | 257/737 |
| 6,080,494 A | * | 6/2000 | Abbott | 428/621 |
| 6,118,080 A | * | 9/2000 | Jiang et al. | 174/253 |
| 6,169,253 B1 | * | 1/2001 | Jairazbhoy et al. | 174/250 |
| 6,252,779 B1 | * | 6/2001 | Pierson et al. | 361/774 |
| 6,310,301 B1 | * | 10/2001 | Heinrich et al. | 174/260 |
| 6,366,209 B2 | | 4/2002 | Dishongh et al. | |
| 6,452,502 B1 | | 9/2002 | Dishongh et al. | |
| 6,509,530 B2 | | 1/2003 | Pearson et al. | |
| 6,580,174 B2 | | 6/2003 | McCormick et al. | |
| 6,627,822 B2 | | 9/2003 | Jackson et al. | |
| 6,630,631 B1 | | 10/2003 | Dishongh et al. | |
| 6,689,680 B2 | * | 2/2004 | Greer | 438/614 |

* cited by examiner

Primary Examiner—Kamand Cuneo
Assistant Examiner—Jeremy Norris
(74) Attorney, Agent, or Firm—Schwabe, Williamson & Wyatt, P.C.

(57) ABSTRACT

Apparatus and methods for interconnecting a SMT component interconnect to a via-in-pad (VIP) interconnect. A first reflowable material is deposited on the VIP bond pad. A sphere having a higher melt temperature than the reflow temperature of the first interconnect material is deposited on the first interconnect material. A first reflow process is performed to interconnect the sphere and the VIP bond pad while the sphere remains solid, and the first reflowable material preventing the first interconnect material from migrating into the via-in-pad.

15 Claims, 5 Drawing Sheets

SURFACE MOUNT TECHNOLOGY TO VIA-IN-PAD INTERCONNECTIONS

FIELD OF THE INVENTION

The present invention relates to electrical assemblies and, more particularly, to substrate and methods for interconnecting via-in-pad electrical interconnects with surface mount technology interconnects, to facilitate high-performance and high-density component interconnection.

BACKGROUND OF INVENTION

It is common that electrical assemblies comprise at least one substrate that is used as a structural platform as well as to electrically interconnect one electrical component with another. The substrate is commonly a relatively flat panel that comprises a variety of electrical interconnects that run through, within, and/or upon the panel. Examples of substrates include, but are not limited to, printed circuit boards (PCB), motherboards, and carrier substrates within microelectronic packages.

One long-standing method of attachment of an electrical component to the substrate is the well established process of providing the substrate with metalized through holes, referred to as plated through hole vias, through which corresponding pins on the electrical component are inserted, and subsequently soldered from the opposite side of the substrate. With the advent of new manufacturing technologies that do away with the pins on the electrical component, attempts have been made to affect an interconnection between the electrical interconnects of a "pin-less" electrical component and the plated through bore via.

One method of interconnecting electrical components to a substrate, or one substrate to another substrate, incorporates surface mount technology (SMT). The SMT electrical component replaces the pin or wire contacts with simple, flat SMT electrical interconnects known as land pads. Surface mount technology electrical components are widely used because of their compact size. Examples of SMT electrical components include, but are not limited to, integrated circuit microprocessor assembled in flip chip-ball grid array (FC-BGA) packaging.

Figure 1:
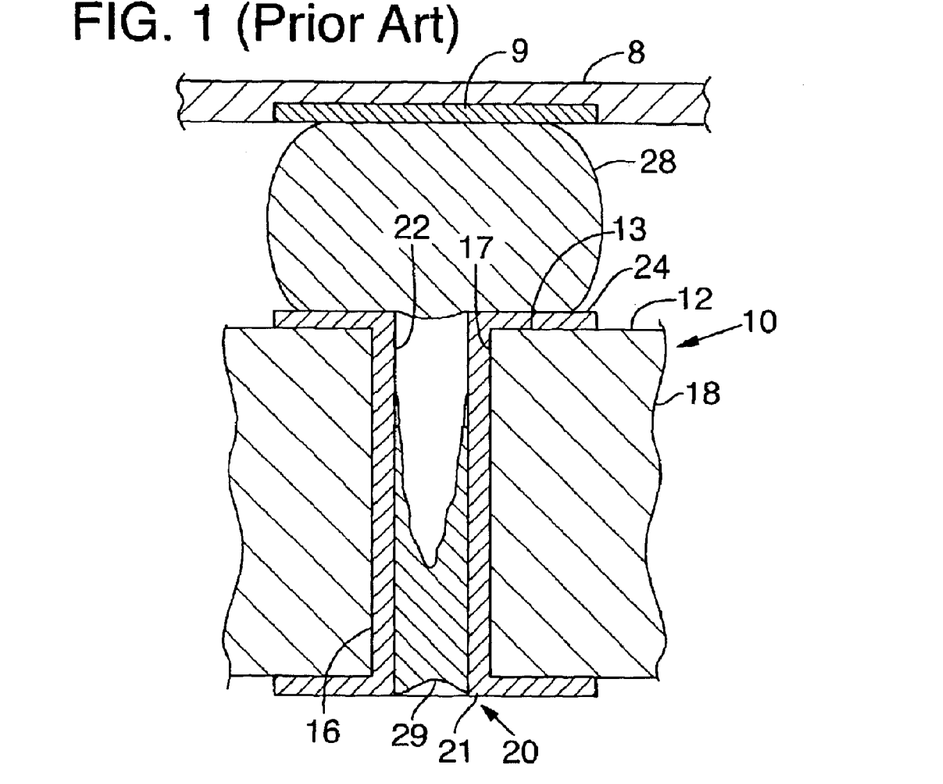
FIG. 1 is a cross-sectional view of a known substrate comprising a type of electrical interconnect known in the art as a via-in-pad (VIP)

FIG. 1 is a cross-sectional view of a VIP substrate 10 which comprises a type of electrical interconnect known in the art as a via-in-pad (VIP) 20. The VIP 20 is a modification of the standard through hole via. The VIP 20 comprises a core through hole 16 extending through the thickness of a substrate core 18 with an electrically conductive liner 21 forming a plated though hole 22. In addition, the electrically conductive liner 21 also forms a VIP bond pad 24 surrounding the mouth of the plated through hole 22 on a portion 13 of a core surface 12 of the substrate core 18.

Figure 2:
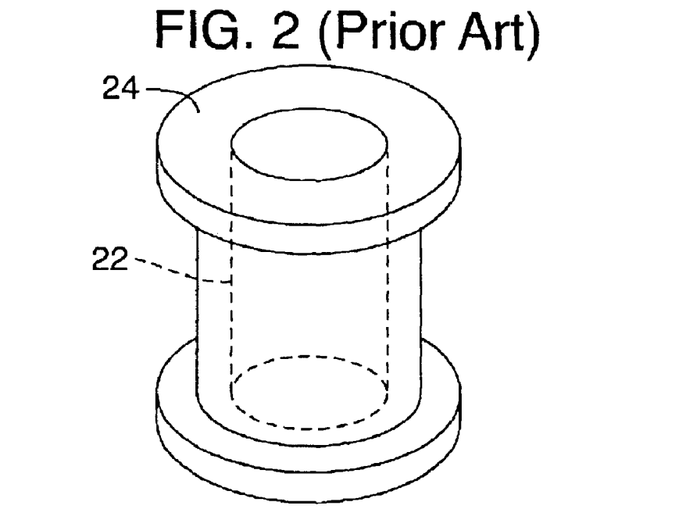
FIG. 2 is a perspective view of the electrically conductive liner and VIP bond pads shown without the substrate core.

FIG. 2 is a perspective view of the electrically conductive liner 21 and VIP bond pad 24 shown without the substrate core 18 for clarity. The core through hole 16 extending through the thickness of the substrate core 18 with an electrically conductive liner 21 is also referred to as a via, hence the designation "via-in-pad". The plated though hole 22 is used as an electrical pathway through the substrate core 18.

The SMT electrical interconnect 9 of a SMT electrical components 8 requires that the electrical interconnect on the surface of the VIP substrate 10 has sufficient surface area to provide for a satisfactory electrical interconnection. The VIP bond pad 24 provides an expanded conductive contact surface to permit interconnection with the SMT electrical interconnect 9 using a interconnect material 28.

The SMT electrical component-to-substrate interconnection is made using a known reflow technique, for example, among others, the controlled collapse chip connection (C4) process. The C4 process is extensively used to interconnect the land pads of a microelectronic die to bond pads on the carrier substrate, but is equally applicable to other SMT electrical component-to-substrate interconnection. Attempts have been made to use the C4 process to interconnect SMT electrical interconnects 9 to VIP bond pads 24.

The C4 process involves providing reflowable electrically conductive interconnect material 28 on each SMT electrical interconnect 9. The SMT electrical component 8 is positioned on top of the VIP substrate 10 such that the interconnect material 28 is in contact with the respective upwardly facing VIP bond pads 24. The assembly is processed at elevated temperature wherein the interconnect material 28 softens and/or melts to form an integral bond with the SMT electrical interconnects 9 and the VIP bond pads 24. Upon cooling, the interconnect material 28 solidifies providing an electrical interconnection between the SMT electrical component 8 and the VIP substrate 10.

Electrical interconnection between the SMT electrical interconnects 9 and the VIP bond pads 24 is not without complications. One complication is the migration of molten interconnect material 28 into the plated though hole 22 by capillary action. If a sufficient amount of interconnect material 28 is drawn away from the VIP bond pad 24 and into the plated though hole 22, there will be insufficient interconnect material 28 to make a proper interconnection.

One process that has been tried in the art to limit the amount of interconnect material 28 migrating into the plated though hole 22 involved plugging it with a soldermask plug 29. Soldermask material is deposited into the plated though hole 22 from the opposite side of the VIP substrate 10 intended to be interconnected. The soldermask plug 29 limits the amount of interconnect material 28 that can flow into the plated though hole 22, as well as blocks the flow out of the other side of the plated though hole 22.

The practice of plugging the opposite end of a plated though hole 22 creates additional problems effecting the electrical interconnection. As the interconnect material 28 is heated to the melting point during the reflow process, volatiles in the soldermask material reach the vapor point and are released as gas. The expanding gas can migrate into the molten interconnect material 28 causing a ballooning effect which may produce a weak or failed interconnection. Further, the ballooned interconnect material 28 can make contact with adjacent VIPs 20 causing an electrical short.

For the reasons stated above, and for other reasons stated below which will become apparent to those skilled in the art upon reading and understanding the present specification, there is a significant need in the art for substrate and methods for interconnecting SMT electrical components to substrate comprising VIP interconnects that offer relatively high density while providing a relatively high quality interconnection.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention.

Figure 3:
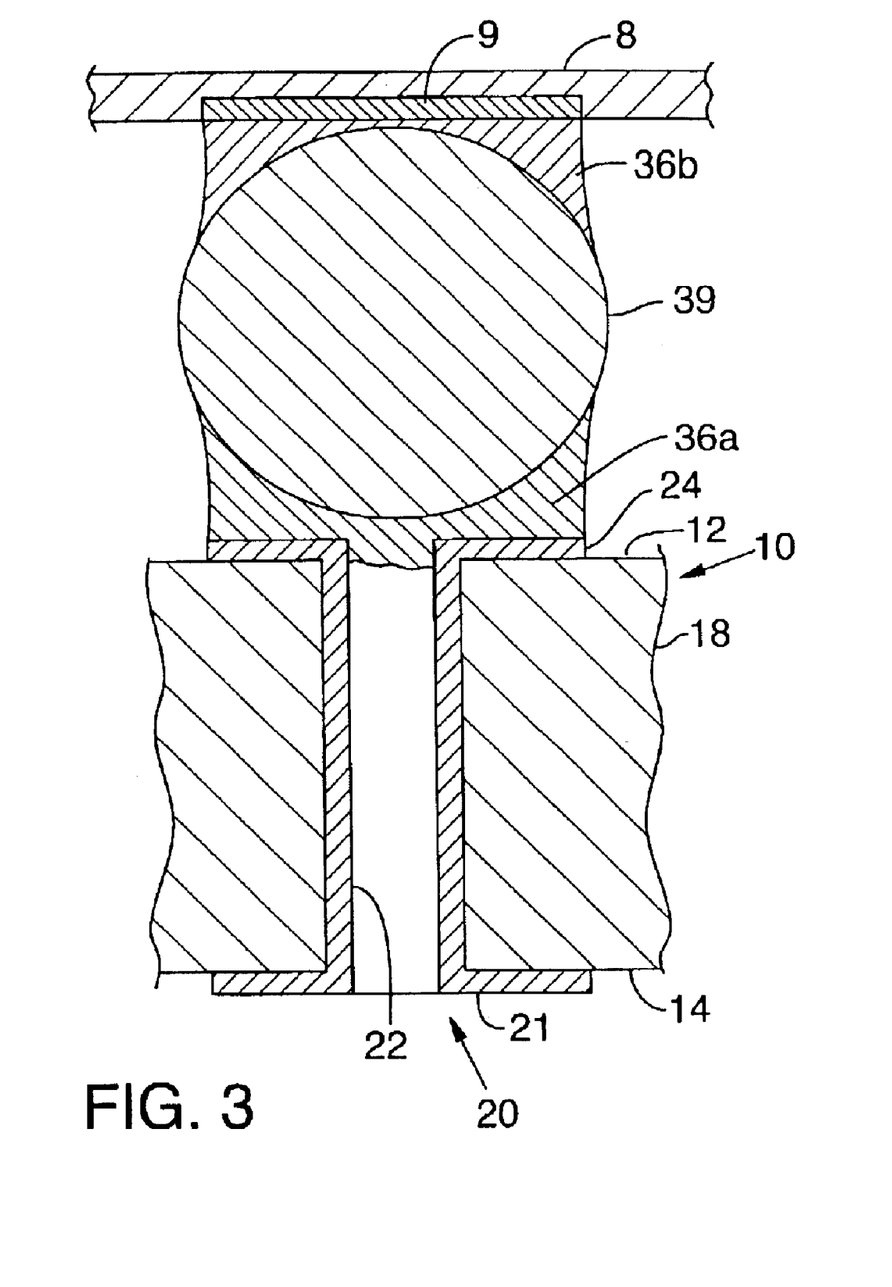
FIG. 3 is a cross-sectional view of an interconnection between a VIP substrate and a SMT electrical component, in accordance with an embodiment of the invention.

FIG. 3 is a cross-sectional view of an interconnection between a VIP substrate 10 and a SMT electrical component 8, in accordance with an embodiment of the invention. The interconnection between each VIP 20 and each SMT electrical interconnect 9 of the SMT electrical component 8 comprises a high melt-temperature electrically conductive sphere 39 and first and second interconnect materials 36a,b, in accordance with an embodiment of the invention. The sphere 39 comprises a conductive material that remains solid during typical reflow processing.

The reflow process is used to form an electrical interconnection between the VIP bond pad 24 and the sphere 39 as well as the SMT electrical interconnect 9 and the sphere 39, with the first and second interconnect materials 36a,b there between, respectively. The reflow process is controlled to provide that the first interconnect material 36a conforms to and covers a portion of the VIP bond pad 24 and conforms to a portion of the sphere 39 forming a meniscus or fillet as a result of surface tension. Similarly, the second interconnect material 36b conforms to and covers a portion of the SMT electrical interconnect 9 and conforms to a portion of the sphere 39 forming a meniscus or fillet structure.

Figure 4:
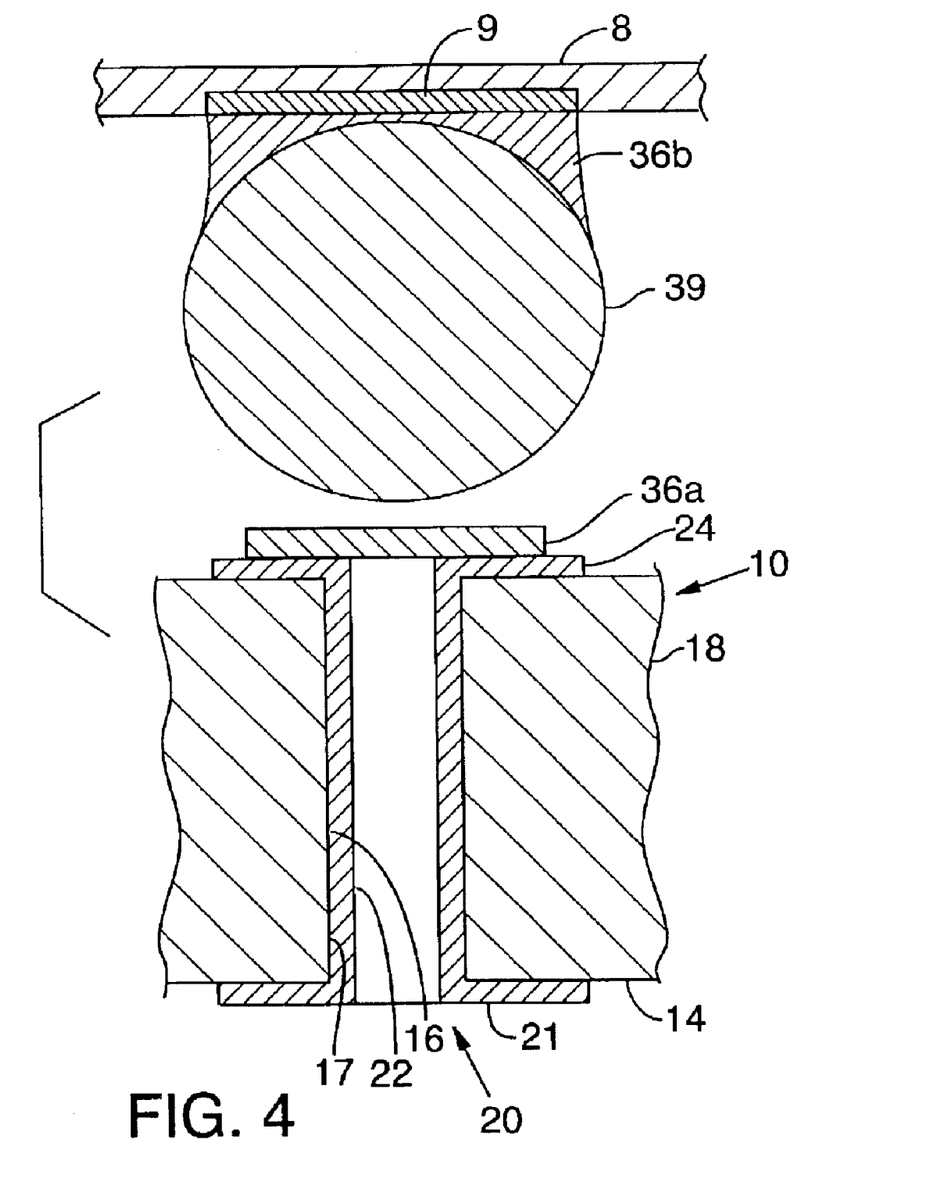
FIG. 4 is a cross-sectional view of a SMT electrical component prior to being electrically interconnected with a VIP by the sphere and interconnect material, in accordance with an embodiment of the invention.

FIG. 4 is a cross-sectional view of a SMT electrical component 8 prior to being electrically interconnected with a VIP 20 by the sphere 39 and first and second interconnect materials 36a,b, in accordance with an embodiment of the invention. The second interconnect material 36b is used to interconnect the SMT electrical interconnect 9 of the SMT electrical component 8 with the sphere 39. The second interconnect material 36b has a reflow temperature that is below the melting temperature of the sphere 39, and therefore, the sphere 39 does not melt, or reflow, but remains in solid form, during the reflow process.

The first interconnect material 36a is deposited onto the VIP bond pad 24. The sphere 39 and the first interconnect material 36a is brought into contact and subjected to a reflow process. The first interconnect material 36a is effectively prevented from migrating away from the VIP bond pad 24 by surface tension forming a meniscus on the sphere 39. The VIP 20 is therefore provided with a reliable interconnection that is not subject to migration of the first interconnect material 36a nor the detrimental effects of expanding gas within the plated though hole 22 encountered with an interconnection using a soldermask plug.

Further, the detrimental effects of interconnect collapse and non-uniform standoff between the VIP substrate 10 and the SMT electrical component 8 is prevented. The sphere 39 provides a solid and non-changing structure that uniformly and consistently holds-apart the VIP substrate 10 and the SMT electrical component 8 at a predetermined distance, for all interconnects on a component, as well as component to component production. This consistent standoff distance provides for the possibility of having a smaller distance than would be possible with variable and unpredictable standoff distances encountered using standard interconnect techniques.

Figure 5:
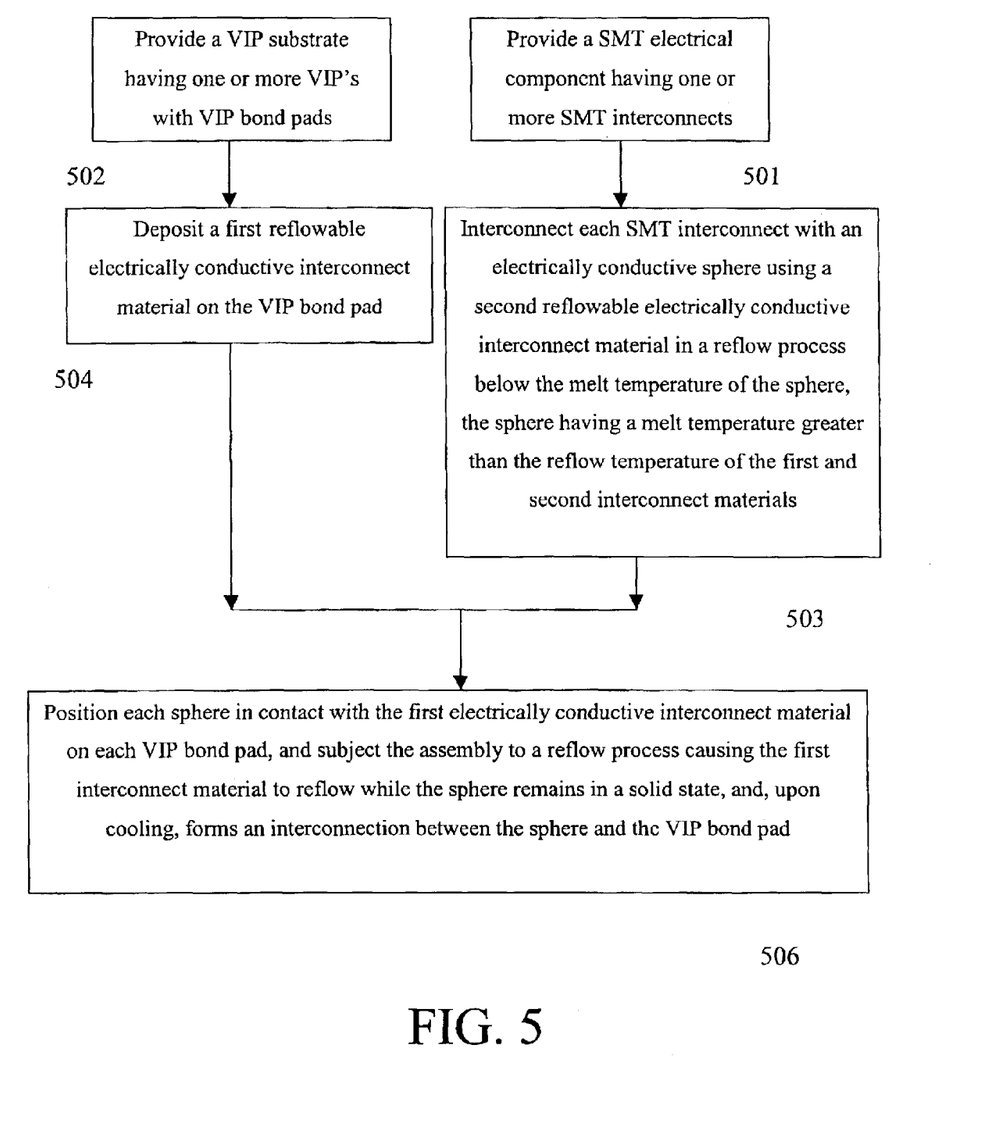
FIG. 5 is a flow diagram of a method for providing a reliable interconnection between a VIP and a SMT electrical interconnect, in accordance with an embodiment of the invention.

FIG. 5 is a flow diagram of a method for providing a reliable interconnection between a VIP and a SMT electrical interconnect, in accordance with an embodiment of the invention. A VIP substrate is provided having one or more VIP's 502. A first reflowable electrically conductive interconnect material is deposited on the VIP bond pad 504. A SMT electrical component with SMT electrical interconnects is provided 501. The SMT electrical interconnect is interconnected with a high melt-temperature electrically conductive sphere with a second reflowable electrically conductive interconnect material 503. The assembly is positioned with the sphere in contact with the first interconnect material and subjected to a reflow process. The first interconnect material reflows while the sphere remains in a solid state. Upon cooling, an interconnection between the VIP bond pad and the sphere is formed 506.

Referring again to FIG. 4, the provided VIP substrate 10 is produced using known techniques. The VIP substrate 10 comprises a substrate core 18 of suitable dielectric material for the intended purpose, including, but not limited to, organic materials such as polyimide, as well as silicon, glass, quartz, ceramic, and the like. The substrate core 18 comprises a plurality of core through holes 16 that pass through the thickness of the substrate core 18. The core through holes 16 can be formed in the substrate core 18 in a number of ways, including, but not limited to, mechanical methods such as drilling, as well as with the use of energy, such as with a laser.

The VIP 20 comprises an electrically conductive liner 21 provided on an inner through hole surface 17 of each core through hole 16. The electrically conductive liner 21 defines a plated though hole 22 as well as at least one VIP bond pad 24 on a portion of the core surface 12 surrounding the mouth of the plated through hole 22. The electrically conductive liner 21 comprises any electrically conductive material suitable for the intended purpose. Examples of materials known in the art include, but not limited to, copper, gold, silver and tungsten.

A number of methods can be used to deposit the first interconnect material 36a on the VIP bond pad 24 and the second interconnect material 36b onto the SMT electrical interconnect 9. The methods include, but are not limited to, printing, dispensing, and placement. For example, interconnect material 36a,b in the form of paste can be silk-screened or dispensed through a needle-type applicator. A pat of solid interconnect material 36a,b can be placed with a pick and place machine. The method of depositing the interconnect material 36a,b will depend on the specific configuration of the system.

A suitable process is used for positioning the sphere 39 onto either the first interconnect material 36a on the VIP bond pad 24 or the second interconnect material 36b on the SMT electrical interconnect 9. Using a pick and place machine to deposit the sphere 39 onto a target location is one of many known methods. A reflow process is used to interconnect the sphere 39 to the target location which reflows the interconnect material 36a,b without melting the sphere 39.

Figure 6:
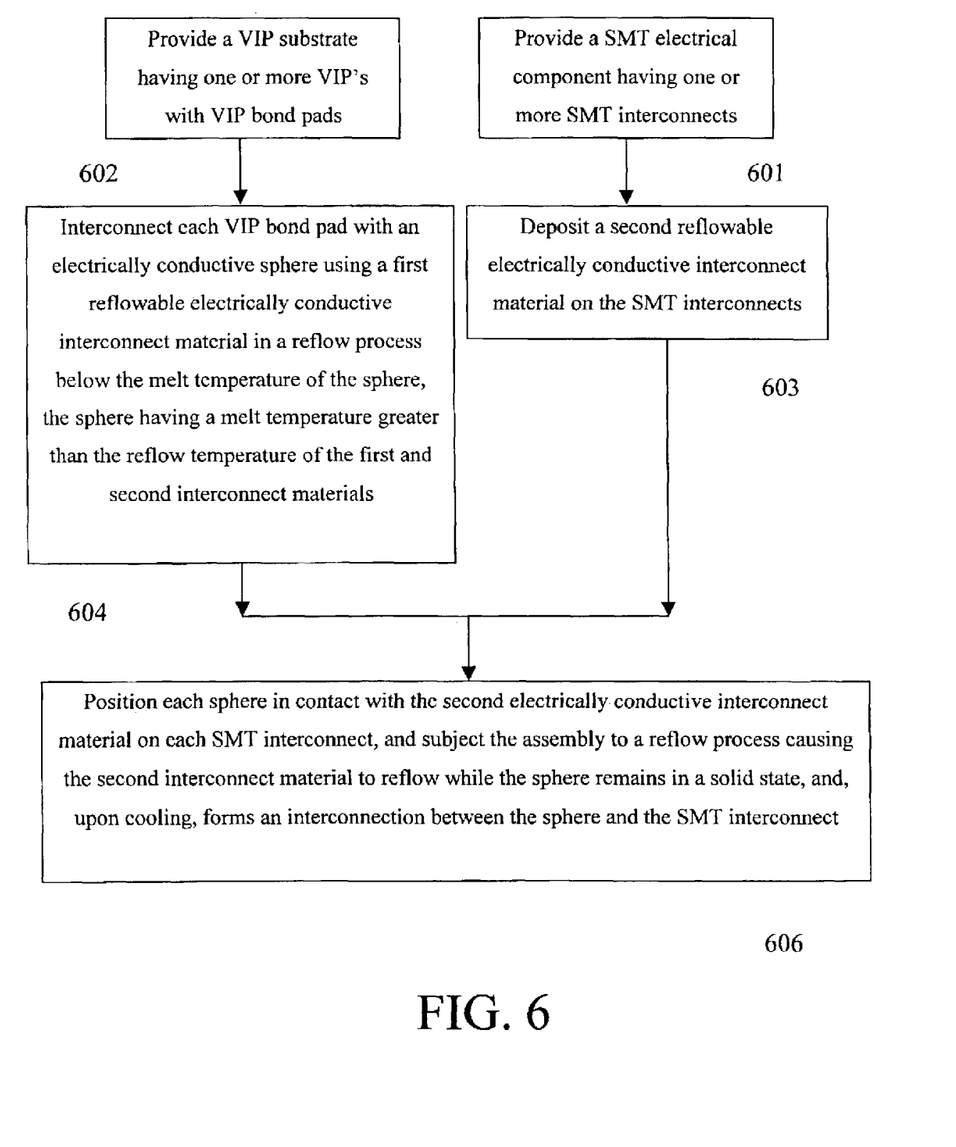
FIG. 6 is a flow diagram of a method for providing a reliable interconnection between a VIP and a SMT electrical interconnect, in accordance with an embodiment of the invention.

FIG. 6 is a flow diagram of a method for providing a reliable interconnection between a VIP and a SMT electrical interconnect, in accordance with an embodiment of the invention. A VIP substrate is provided having one or more VIP's 602. Each VIP bond pad is interconnected with a high melt-temperature electrically conductive sphere using a first reflowable electrically conductive interconnect material 604, without melting the sphere.

The SMT electrical component is provided having one or more SMT electrical interconnects corresponding to the one or more VIP's 601. The SMT electrical interconnects are provided with a second reflowable electrically conductive interconnect material 603. The SMT electrical component is disposed such that the second interconnect material on the SMT electrical interconnects is in contact with the spheres interconnected with the VIP bond pads. The assembly is subjected to a reflow process causing the second interconnect material to reflow while the sphere remains in a solid state, and, upon cooling, form an interconnect between the sphere and the SMT electrical interconnect as well as retaining the interconnection between the VIP bond pad and the sphere 606.

Although the interconnect material between the VIP bond pad and the sphere may undergo reflow as well, the first interconnect material will remain between the VIP bond pad and the sphere by surface tension. In the embodiments in accordance with the present invention, it is not required that the first and second reflowable electrically conductive interconnect material 36a,b be different. Since the sphere 39 acts to retain the interconnect material 36a,b to the desired location during reflow, the methods are valid regardless whether the first and second interconnect materials 36a,b are the same or different.

Referring again to FIG. 4, a cross-sectional view of the SMT electrical interconnect 9 and the sphere 39 after having undergone a first reflow process is illustrated. The first reflow process comprises heating the assembly to a temperature wherein the second interconnect material 36b melts and, due to surface tension, flows to conform to the sphere 39 and the SMT electrical interconnect 9, to form an integral electrical interconnection therewith upon cooling.

Following the attachment of the sphere 39 to the electrical interconnect 9, the SMT electrical component 8 is registered with the VIP substrate 10 with each sphere 39 positioned and in contact with the first interconnect material 36a on the VIP bond pad 24. The assembly is processed such that the second interconnect material 36b undergoes reflow with the sphere 39 remaining solid. The first interconnect material 36a forms an electrical interconnection with the VIP bond pad 24 and the sphere 39 upon cooling.

The VIP substrate 10 and the SMT electrical component 8 form an electrical assembly that can be used as a component to an electrical system. In one embodiment, the SMT electrical component 8 is a microelectronic die, such as, but not limited to, an integrated circuit die.

An interconnect material commonly used in the C4 process, and which is suitable for use in accordance with the embodiments of the invention, is a tin-based solder comprising 37% lead (Sn/37Pb solder) having a melting temperature of 183 C. A typical reflow temperature for Sn/37Pb solder is 205 C. In accordance with the present invention, a high melt-temperature electrically conductive sphere 39 having a higher melt temperature than the reflow temperature of the electrically conductive interconnect material 36a,b is required.

Other interconnect material suitable for the particular purpose include, but are not limited to, lead-free, tin-based solder of 3.5% silver (Sn/3.5Ag solder) with a melting temperature of 221 C and a reflow temperature of 240 C, and lead-free, tin-based solder having 5% antimony (Sn/5Sb solder) with a melting temperature of 234 C and a reflow temperature of 255 C.

The high melt-temperature electrically conductive sphere 39 must remain in solid form during the proposed reflow processes. Suitable materials from which the sphere is made include, but not limited to, copper with a melt temperature of 1083 C, aluminum with a melt temperature of 670 C, silver with a melt temperature of 961 C, and gold with a melt temperature of 1063 C.

One can appreciate that since the high melt-temperature electrically conductive sphere 39 remains solid throughout both of the reflow process, variations in the standoff distance between the VIP substrate 10 and the SMT electrical component 8 is prevented. The sphere 39 provides a solid and non-changing structure that uniformly and consistently separates the VIP substrate 10 and the SMT electrical component 8 at a predetermined distance, for all interconnects on a particular component, as well as from component to component in production. This consistent standoff distance provides for the possibility of having a smaller distance than would be possible with variable and unpredictable standoff distances encountered using standard interconnect techniques.

The substrate and methods of providing electrical interconnections using a non-melting sphere in accordance with the embodiment of the invention, can be utilized in many applications which require the interconnection of SMT electrical components with a VIP substrate 10. Examples of SMT electrical components 8 that would benefit from the methods include, but are not limited to, microprocessors or microcontrollers, memory circuits, application specific integrated circuits (ASIC), digital signal processors (DSP), radio frequency circuits, amplifiers, power converters, filters, clocking circuits, passive elements such as inductors, capacitors, and resistors, and the like. Examples of electrical assemblies that can take advantage of the benefits of the solid sphere interconnects include, but are not limited to, integrated circuit packages and semiconductor device packages.

In other embodiments in accordance with the present invention, the VIP substrate 10 incorporating solid sphere-based interconnections is a component of an electrical system. An electrical system is broadly defined herein as any product comprising an electrical assembly. Examples of electrical systems include, but are not limited to, computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, etc.), and the like.

It is understood and appreciated that the VIP substrate 10 incorporating solid sphere-based interconnections may not necessarily be used exclusively for electrical communication between SMT electrical components. The VIP substrate 10 incorporating solid sphere-based interconnections can also be utilized, for example, but not limited to, as an interconnect from the substrate to a heatsink for thermal dissipation. Therefore, the apparatus and methods for the interconnection of other components and the VIP substrate 10 with incorporating solid sphere-based interconnects is also within the scope of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method of making a via-in-pad substrate, comprising:
   providing a substrate having at least one via-in-pad interconnect comprising a bond pad;
   depositing a reflowable electrically conducting interconnect material on the bond pad;
   depositing a sphere comprising an electrically conductive material having a melt temperature higher than the reflow temperature of the interconnect material; and
   subjecting the substrate to a reflow process below the melt temperature of the sphere to interconnect the via-in-pad interconnect to the sphere with the interconnect material so as to prevent by surface tension, the interconnect material from migrating into the via-in-pad.

2. The method of claim 1, wherein depositing a reflowable electrically conductive interconnect material on the at least one bond pad comprises:
   placing a print screening mask onto the substrate, the mask comprising an
   aperture corresponding to each of the at least one via-in-pad interconnects, the aperture substantially aligned with and adapted to expose at least a portion of the bond pad;
   extruding a reflowable electrically conductive interconnect material through the aperture and onto the bond pad; and
   removing the mask leaving the interconnect material on the bond pad.

3. The method of claim 1, wherein depositing a reflowable electrically conductive interconnect material on the bond pad comprises:
   placing a pat of preformed reflowable electrically conductive interconnect material onto the bond pad.

4. The method of claim 1, wherein depositing a reflowable electrically conductive interconnect material comprises depositing a material selected from the group consisting of lead-free, tin-based solder of 3.5% silver (Sn/3.5Ag solder) with a melt temperature of 221 C and a reflow temperature of about 240 C, and lead-free, tin-based solder having 5% antimony (Sn/5Sb solder) with a melt temperature of 234 C and a reflow temperature of about 255 C, and wherein the sphere has a melt temperature greater than 255 C.

5. The method of claim 1, wherein depositing a sphere comprising an electrically conductive material having a melt temperature higher than the reflow temperature of the interconnect material comprises:
   depositing a sphere comprising a material selected from the group consisting of copper, silver, gold, and aluminum.

6. A method for interconnecting a component interconnect to a substrate via-in-pad interconnect, comprising:
   providing a substrate having at least one via-in-pad interconnect comprising a bond pad;
   depositing a first reflowable electrically conducting interconnect material on the bond pad;
   depositing a sphere comprising an electrically conductive material having a melt temperature higher than the reflow temperature of the first interconnect material;
   subjecting the substrate to a reflow process below the melt temperature of the sphere to interconnect each bond pad with each sphere so as to prevent, by surface tension, the interconnect material from migrating into the at least one via-in-pad;
   interposing a second reflowable electrically conductive interconnect material between the component interconnect and the sphere of the corresponding via-in-pad interconnect, the second interconnect material having a reflow temperature lower than that of the sphere; and
   subjecting the substrate and component to a reflow process below the melt temperature of the sphere to reflow the second reflowable interconnect material to effect an interconnection between the sphere and the component interconnect.

7. The method of claim 6, wherein the process of depositing a first reflowable electrically conductive interconnect material on the at least one bond pad is selected from the group of processes consisting of print screening and pat placement.

8. The method of claim 6, wherein depositing a first reflowable electrically conductive interconnect material comprises depositing a first reflowable electrically conductive interconnect material selected from the group consisting of: lead-free, tin-based solder of 3.5% silver (Sn/3.5Ag solder) with a melt temperature of 221 C and a reflow temperature of 240 C; lead-free, tin-based solder having 5% antimony (Sn/5Sb solder) with a melt temperature of 234 C and a reflow temperature of 255 C; and tin-based solder comprising 37% lead (Sn/37Pb solder) having a melt temperature of 183 C and a reflow temperature of 205 C.

9. The method of claim 6, wherein the sphere comprises a material selected from the group consisting of copper, silver, gold, and aluminum.

10. A substrate, comprising:
    at least one via-in-pad interconnect comprising a bond pad;
    a reflowable electrically conductive interconnect material deposited on the bond pad; and
    a sphere electrically connected with both the interconnect material and the bond pad, the sphere having a melt temperature higher than the reflow temperature of the interconnect material and disposed to prevent, by surface tension, the interconnect material from migrating into the at least one via-in-pad during a reflow process.

11. The substrate of claim 10, wherein the sphere comprises a material selected from the group consisting of copper, silver, gold, and aluminum.

12. The substrate of claim 10, wherein the reflowable electrically conductive interconnect material is selected from the group consisting of: lead-free, tin-based solder of 3.5% silver (Sn/3.5Ag solder) with a melt temperature of 221 C and a reflow temperature of 240 C; lead-free, tin-based solder having 5% antimony (Sn/5Sb solder) with a melt temperature of 234 C and a reflow temperature of 255 C; and tin-based solder comprising 37% lead (Sn/37Pb solder) having a melt temperature of 183 C and a reflow temperature of 205 C.

13. An electrical device, comprising:

an electrical component having at least one component interconnect;

a substrate having at least one via-in-pad interconnect comprising a bond pad;

a first reflowable electrically conductive interconnect material deposited onto the at least one bond pad;

a second reflowable electrically conductive interconnect material deposited onto the at least one component interconnect; and a sphere comprising an electrically conductive material having a melt temperature higher than the reflow temperature of the first and second interconnect materials, the first interconnect material electrically interconnecting the sphere with the bond pad, and the second interconnect material electrically interconnecting the sphere with the component interconnect, the sphere further disposed to prevent, by surface tension, the first interconnect material from migrating into the at least one via-in-pad during a reflow process.

14. The electrical device of claim 13, wherein the sphere comprises a material selected from the group consisting of copper, silver, gold, and aluminum.

15. The electrical device of claim 13, wherein the first and second interconnect material is selected from the group consisting of: lead-free, tin-based solder of 3.5% silver (Sn/3.5Ag solder) with a melt temperature of 221 C and a reflow temperature of 240 C; lead-free, tin-based solder having 5% antimony (Sn/5Sb solder) with a melt temperature of 234 C and a reflow temperature of 255 C; and tin-based solder comprising 37% lead (Sn/37Pb solder) having a melt temperature of 183 C and a reflow temperature of 205 C.

* * * * *